(12) United States Patent
Barnikel et al.

(10) Patent No.: US 9,719,360 B2
(45) Date of Patent: Aug. 1, 2017

(54) TURBOMACHINE COMPONENT HAVING A FUNCTIONAL COATING

(71) Applicant: Siemens Aktiengesellschaft, Munich (DE)

(72) Inventors: Jochen Barnikel, Mulheim an der Ruhr (DE); Christian Bohme, Straelen (DE); Torsten-Ulf Kern, Wesel (DE); Jorg Schurhoff, Mulheim a.d. Ruhr (DE); Shilun Sheng, Oberhausen (DE); Armin de Lazzer, Mulheim an der Ruhr (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 0 days.

(21) Appl. No.: 14/394,083

(22) PCT Filed: Apr. 2, 2013

(86) PCT No.: PCT/EP2013/056855
§ 371 (c)(1),
(2) Date: Oct. 11, 2014

(87) PCT Pub. No.: WO2013/156296
PCT Pub. Date: Oct. 24, 2013

(65) Prior Publication Data
US 2015/0330232 A1    Nov. 19, 2015

(30) Foreign Application Priority Data
Apr. 16, 2012   (EP) .................................... 12164302

(51) Int. Cl.
*B32B 15/18* (2006.01)
*F01D 5/28* (2006.01)
(Continued)

(52) U.S. Cl.
CPC .......... *F01D 5/288* (2013.01); *C23C 14/0641* (2013.01); *C23C 28/042* (2013.01);
(Continued)

(58) Field of Classification Search
None
See application file for complete search history.

(56) References Cited

U.S. PATENT DOCUMENTS 4,564,392 A * 1/1986 Ohhashi .................. C22C 38/24
420/64
5,415,706 A   5/1995 Scarlin
(Continued)

FOREIGN PATENT DOCUMENTS

CN    1212742 A    3/1999
DE    19607736 A1  9/1997
(Continued)

OTHER PUBLICATIONS

JP Notice of Allowance dated Dec. 12, 2016, for JP patent application No. 2015-506166.

*Primary Examiner* — Daniel J Schleis
(74) *Attorney, Agent, or Firm* — Beusse Wolter Sanks & Maire

(57) ABSTRACT

A turbomachine component having a main body and a multilayer coating, which is applied directly to the main body is provided. The multilayer coating is at least 5 μm and at most 35 μm thick and has a plurality of layers applied directly one on top of the other, wherein the layer applied directly to the main body is an adhesion promoting layer, which comprises chromium nitride, and at least one of the remaining layers comprises a hard material.

13 Claims, 1 Drawing Sheet

(51) Int. Cl.
  *F01D 25/00* (2006.01)
  *C23C 14/06* (2006.01)
  *C23C 28/04* (2006.01)

(52) U.S. Cl.
  CPC .......... *C23C 28/044* (2013.01); *F01D 25/005* (2013.01); *F05D 2220/31* (2013.01); *F05D 2300/132* (2013.01); *F05D 2300/171* (2013.01); *F05D 2300/174* (2013.01)

(56) References Cited

U.S. PATENT DOCUMENTS

| | | | |
|---|---|---|---|
| 6,350,325 B1 | 2/2002 | Kern | |
| 6,419,453 B2 | 7/2002 | Fukui et al. | |
| 8,043,730 B2 | 10/2011 | Kawano et al. | |
| 8,118,561 B2 * | 2/2012 | Bruce | C23C 14/0641 415/200 |
| 8,129,041 B2 | 3/2012 | Forte | |
| 2004/0106000 A1 | 6/2004 | Giannozzi | |
| 2008/0102296 A1 | 5/2008 | Ghasripoor et al. | |
| 2009/0123737 A1 | 5/2009 | Hananaka | |
| 2010/0062257 A1 * | 3/2010 | Morstein | B23F 21/16 428/408 |
| 2010/0086397 A1 * | 4/2010 | Varanasi | C23C 14/028 415/200 |
| 2010/0140529 A1 | 6/2010 | Forte | |
| 2011/0045264 A1 | 2/2011 | Eichmann | |
| 2012/0070329 A1 | 3/2012 | Kern et al. | |

FOREIGN PATENT DOCUMENTS

| | | |
|---|---|---|
| DE | 102008020607 A | 11/2008 |
| DE | 102008019891 A | 10/2009 |
| EP | 0770696 A1 | 5/1997 |
| EP | 2230330 A1 | 9/2010 |
| JP | 2001247942 A | 9/2001 |
| JP | 2002348642 A | 12/2002 |
| JP | 2004169176 A | 6/2004 |
| JP | 2006037212 A | 2/2006 |
| JP | 2008163449 A | 7/2008 |
| JP | 2010059534 A | 3/2010 |
| JP | 2010242221 A | 10/2010 |
| WO | 9632517 A1 | 10/1996 |
| WO | 2010133244 A1 | 11/2010 |

* cited by examiner

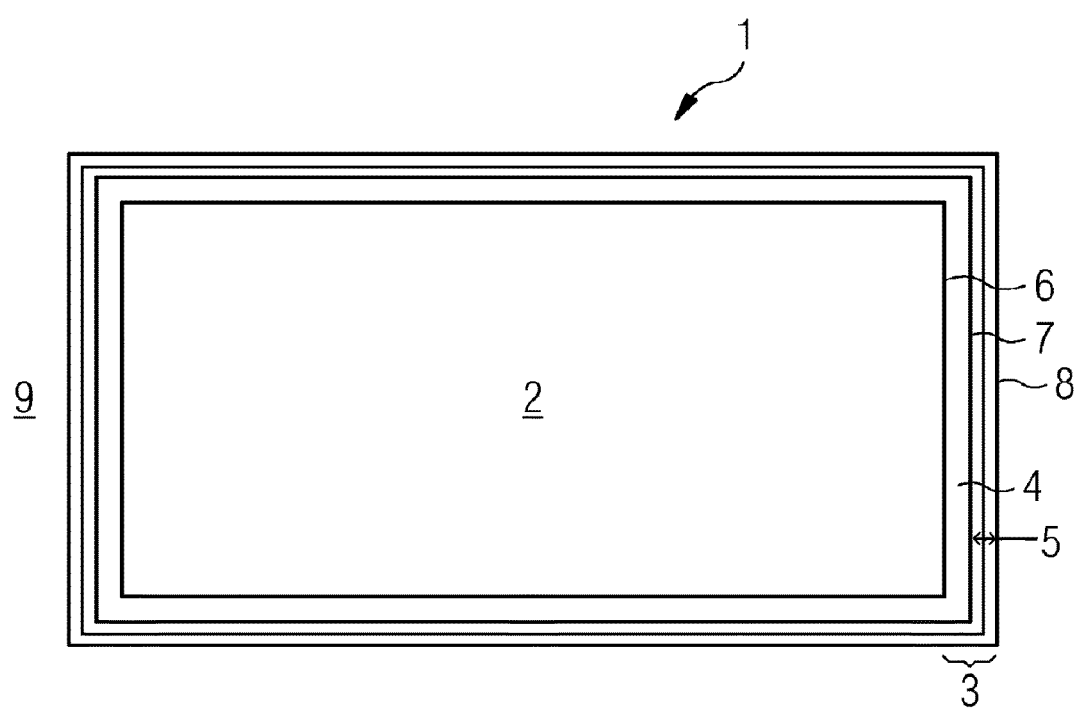

TURBOMACHINE COMPONENT HAVING A FUNCTIONAL COATING

CROSS REFERENCE TO RELATED APPLICATIONS

This application is the US National Stage of International Application No. PCT/EP2013/056855 filed Apr. 2, 2013, and claims the benefit thereof. The International Application claims the benefit of European Application No. EP12164302 filed Apr. 16, 2012. All of the applications are incorporated by reference herein in their entirety.

FIELD OF INVENTION

The invention relates to a turbomachine component having a functional coating.

BACKGROUND OF INVENTION

In a steam turbine, steam is expanded to generate rotational energy. The steam turbine has a plurality of stages, each stage having a guide vane ring with a plurality of guide vanes and a rotor blade ring with a plurality of rotor blades. The rotor blades are fitted to the shaft of the steam turbine and rotate during operation of the steam turbine; the guide vanes are fitted to the housing of the steam turbine and are stationary.

During operation of the steam turbine, the blades or vanes are exposed to various degradation processes, for example creep. Creep is slowly proceeding plastic deformation of the blade or vane under the action of a load at an elevated temperature. The load can originate, for example, from the steam flowing in the steam turbine and, in the case of the rotor blades, can be caused by the centrifugal force on account of their rotation. Furthermore, the surfaces of the blades or vanes can oxidize at appropriately high temperatures in the presence of steam, high temperature levels of this type regularly being achieved in a high-pressure steam turbine or in a medium-pressure steam turbine and typically being more than 540° C.

In the case that an oxide layer has formed on the surfaces of the rotor blades and/or of the guide vanes, micro-notches or micro-cracks can form on the surfaces. This reduces the strength of the rotor blades and/or of the guide vanes, and therefore, for example, the bending fatigue strength of the rotor blades and/or of the guide vanes is reduced or at least influenced.

To avoid the oxidation, the rotor blades and/or the guide vanes are conventionally produced from high-cost alloys.

US 2009/123737 A1 discloses turbomachine components having a main body which comprises chromium steel. The main body is coated with a nitrided hard layer. A layer comprising chromium nitride is applied to the latter by vapor deposition.

DE 10 2008 020 607 A1 discloses an object with a first surface and a coating applied thereto. The coating comprises a first layer comprising chromium nitride, to which a further layer is applied.

DE 10 2008 019 891 A1 discloses an erosion-resistant coating in particular for gas turbine components. The coating in this case has alternately relatively hard and relatively soft layers. For better adhesion, an adhesion promoting layer comprising chromium nitride is provided directly on the gas turbine component.

EP 2 230 330 A1 discloses a plastics component having an erosion-resistant layer for applications with erosive loading. The erosion-resistant coating is a multilayer coating system with one layer consisting of a metal and one layer consisting of ceramic, or ceramic layers of differing hardness.

SUMMARY OF INVENTION

It is an object of the invention to provide a turbomachine component in which the aforementioned problems are overcome and which has a good resistance to oxidation and also a long service life.

The turbomachine component according to aspects of the invention has a main body and a multilayer coating, which is applied directly to the main body, has a thickness of at least 5 μm and at most 35 μm and also has a plurality of layers applied directly to one another, wherein the layer applied directly to the main body is an adhesion promoting layer comprising chromium nitride, and at least one of the remaining layers comprises a hard material. The multilayer coating is also referred to as a functional coating. The multilayer coating has a good resistance to oxidation and therefore also protects the main body against the oxidation. The multilayer coating makes it possible for the main body to be exposed to a higher temperature without significant oxidation of the main body arising, as would be possible without the multilayer coating. The multilayer coating can cover the main body completely or it can be applied merely to the points which are directly exposed to a corrosive medium during operation of the turbomachine. If the turbomachine component is a rotor blade or a guide vane, for example, it is sufficient to provide the multilayer coating on the main blade or vane part of the rotor blade or of the guide vane and to leave the blade or vane root of the rotor blade or of the guide vane free.

Through the provision of the adhesion promoting layer, the multilayer coating advantageously has a good bond between the multilayer coating and the main body, as a result of which the multilayer coating has a high resistance to detachment. Since the multilayer coating is formed with a thickness of merely at most 35 μm, the flow in the turbomachine is advantageously negligibly influenced. As a consequence, the multilayer coating does not need to be taken into consideration when designing the turbomachine component. The mechanical properties of the main body, in particular its creep strength and fatigue strength, are advantageously not influenced as a result of the multilayer coating. In addition to the resistance to oxidation, the turbomachine component also has a high resistance to particle erosion. Particle erosion can arise when particles are carried along by the flow during operation of the turbomachine component and strike against the surface of the turbomachine component. This is of relevance particularly in the case of rotor blades, because here the relative velocity between the particles and the rotor blades is particularly high on account of the rotation of the rotor blades and the particles therefore strike against the rotor blades with a particularly high kinetic energy.

The main body according to aspects herein comprises a chromium steel, an austenitic steel and/or a nickel base alloy. These materials advantageously have a high resistance to vibration stresses and to creep. It is advantageous that the hard material comprises chromium nitride, chromium aluminum nitride and/or titanium aluminum nitride. The content of chromium in the chromium steel is advantageously at least 8% by mass and at most 13% by mass. The chromium steel is advantageously a martensitic chromium steel. The martensitic chromium steel having the content of chromium of 8% by mass to 13% by mass advantageously has a high resistance to vibrations and a high creep resistance.

It is advantageous that the chromium steel comprises nitrogen. The content of nitrogen in the chromium steel is advantageously at least 0.010% by mass and at most 0.080% by mass. The diffusion of atoms from the adhesion promoting layer into the main body and vice versa can occur during the application of the adhesion promoting layer to the main body. As a result of the provision of nitrogen in the main body, no foreign elements penetrate into the region of the main body close to the surface upon diffusion, and therefore changes to the microstructure of the main body are advantageously prevented during the application of the adhesion promoting layer. The chromium steel furthermore advantageously comprises molybdenum and/or vanadium. The chromium steel advantageously comprises from 9.0 to 11.0% by mass chromium, from 1.0 to 2.0% by mass molybdenum, from 0.1 to 1.0% by mass nickel and from 0.10 to 0.30% by mass vanadium. The remaining constituent is substantially iron according to certain embodiments of the invention.

It is advantageous that the layers of the multilayer coating are applied by means of a physical vapor deposition (PVD) process. This advantageously gives rise to a low averaged surface roughness $R_z$ of the applied layers of less than or equal to 2.5. The physical vapor deposition process may be carried out at a coating temperature of less than 600° C. This coating temperature advantageously lies below the annealing temperature of the chromium steel, as a result of which there are no or barely any changes to the mechanical properties, in particular the residual stresses, of the main body during the application of the multilayer coating. Moreover, it is advantageously the case that the turbomachine component is not distorted during the application. Tests on samples with and without the multilayer coating have shown that the multilayer coating does not impair the resistance of the main body to vibrations.

It is advantageous that the turbomachine component is a component of a steam turbine. Oxidation is a problem in particular in the presence of steam, and therefore the provision of the turbomachine component according to aspects of the invention in a steam turbine is particularly advantageous. The turbomachine component may be a blade or vane. The blade or vane is a component which is subjected to particularly high levels of loading, in particular by vibrations, and therefore the provision of the turbomachine component as the blade or vane is particularly advantageous.

BRIEF DESCRIPTION OF THE DRAWINGS

Hereinbelow, the invention will be explained in more detail on the basis of the accompanying schematic drawing.

The FIGURE shows a cross section through a turbomachine component according to the invention.

DETAILED DESCRIPTION OF INVENTION

As is apparent from the FIGURE, a turbomachine component 1 has a main body 2 and a multilayer coating 3. The main body 2 comprises a chromium steel and has a rectangular cross section.

Any desired shapes of the main body 2 with any desired cross sections are also conceivable, however. In the FIGURE, the multilayer coating 3 has been applied around the entire cross section of the main body 2. It is also conceivable for the multilayer coating to be applied merely at selected points of the main body 2.

The multilayer coating 3 comprises an adhesion promoting layer 4 and a protective layer 5. The adhesion promoting layer 4 comprises chromium nitride and is applied directly to the main body 2. A first interface 6 is formed between the main body 2 and the adhesion promoting layer 4. A protective layer 5 is applied directly to the adhesion promoting layer 4. A second interface 7 is formed between the adhesion promoting layer 4 and the protective layer 5. The protective layer 5 here can comprise either chromium nitride, chromium aluminum nitride and/or titanium aluminum nitride.

In the FIGURE, the protective layer 5 is shown as having plural layers applied directly to one another. It is conceivable to provide a protective layer having a single layer. According to the invention, the multilayer coating in this case has a layer thickness of at least 5 μm and at most 35 μm. In this case, either all the protective layers can comprise chromium nitride or chromium aluminum nitride or the protective layers can comprise alternately chromium nitride and chromium aluminum nitride.

The individual layers 4, 5 of the multilayer coating 3 are each applied by a physical vapor deposition process. The coating temperature in the vapor deposition process is selected in such a way that it lies below the annealing temperature of the main body 2, in particular the coating temperature being selected to be lower than 600° C. It is conceivable that the temperature of the adhesion promoting layer 4 and of the main body 2 is temporarily lowered to form the second interface 7 between the application of the adhesion promoting layer 4 and of the protective layer 5.

The multilayer coating 3 has a surface 8, which is exposed to a medium 9 during operation of the turbomachine. If this medium 9 is a corrosive medium, the multilayer coating 3 protects the main body against oxidation.

Hereinbelow, the invention will be explained in more detail on the basis of a plurality of examples, in which the turbomachine component 1 is a steam turbine blade or vane.

In a first exemplary embodiment, the main body 2 of the steam turbine blade or vane is produced from a chromium steel comprising 10% by mass chromium, 1.0% by mass molybdenum, 0.5% by mass nickel, 0.10% by mass vanadium and 88.4% by mass iron. The main body has a main blade or vane part and a blade or vane root. An adhesion promoting layer having a thickness of 10 μm and comprising chromium nitride is applied directly to the entire surface of the main blade or vane part. A first protective layer comprising chromium aluminum nitride and having a thickness of 10 μm is applied directly to the adhesion promoting layer. A second protective layer likewise comprising chromium aluminum nitride and having a thickness of 10 μm is applied directly to the first protective layer, and therefore the multilayer coating consisting of the two protective layers and the adhesion promoting layer has an overall thickness of 30 μm. In this case, the adhesion promoting layer and the two protective layers are applied by means of a physical vapor deposition process at a temperature of lower than 600° C.

In a second exemplary embodiment, the main body 2 of the steam turbine blade or vane is produced from a nickel base alloy and has a main blade or vane part and a blade or vane root. An adhesion promoting layer having a thickness of 10 μm and comprising chromium nitride is applied directly to the entire surface of the main blade or vane part. A protective layer comprising titanium aluminum nitride and having a thickness of 15 μm is applied directly to the adhesion promoting layer, and therefore the multilayer coating consisting of the protective layer and the adhesion promoting layer has an overall thickness of 25 μm. In this case, the adhesion promoting layer and the protective layer are applied by means of a physical vapor deposition process at a temperature of lower than 600° C.

Although the invention has been illustrated and described in more detail by the preferred exemplary embodiments, the invention is not limited by the disclosed examples, and other variations can be derived therefrom by a person skilled in the art without departing from the scope of protection of the invention.

The invention claimed is:

1. A turbomachine component comprising:
a main body, which comprises a chromium steel, and
a multilayer coating comprising an adhesion promoting layer which is applied directly to the main body and which comprises chromium nitride, and a plurality of protective layers, wherein one protective layer is applied directly to the adhesion promoting layer and every other protective layer is applied directly to an underlying protective layer,
wherein the multilayer coating comprises a thickness of 30 µm to 35 µm,
wherein each protective layer comprises chromium aluminum nitride, and
wherein each protective layer comprises a thickness of at least 10 µm.

2. The turbomachine component as claimed in claim 1, wherein the content of chromium in the chromium steel is at least 8% by mass and at most 13% by mass.

3. The turbomachine component as claimed in claim 1, wherein the chromium steel is a martensitic chromium steel.

4. The turbomachine component as claimed in claim 1, wherein the chromium steel comprises nitrogen.

5. The turbomachine component as claimed in claim 4, wherein the content of nitrogen in the chromium steel is at least 0.010% by mass and at most 0.080% by mass.

6. The turbomachine component as claimed in claim 1, wherein the chromium steel comprises molybdenum and/or vanadium.

7. The turbomachine component as claimed in claim 6, wherein the chromium steel comprises from 9.0 to 11.0% by mass chromium, from 1.0 to 2.0 by mass molybdenum, from 0.1 to 1.0% by mass nickel, from 0.10 to 0.30% by mass vanadium and substantially iron as the remaining constituent.

8. The turbomachine component as claimed in claim 1, wherein the adhesion promoting layer and the plurality of protective layers are applied by a physical vapor deposition process.

9. The turbomachine component as claimed in claim 8, wherein the physical vapor deposition process is carried out at a coating temperature of less than 600° C.

10. The turbomachine component as claimed in claim 1, wherein the turbomachine component is a rotor blade or a guide vane of a steam turbine.

11. The turbomachine component as claimed in claim 1, wherein a topmost protective layer of the plurality of layers comprises a surface that is exposed to a medium during operation.

12. A turbomachine component comprising:
a main body, which comprises a chromium steel comprising from 9.0 to 11.0% by mass chromium, and
a multilayer coating comprising an adhesion promoting layer which is applied directly to the main body and which comprises chromium nitride, and at least two protective layers, wherein one protective layer is applied directly to the adhesion promoting layer and every other protective layer is applied directly to an underlying protective layer,
wherein the multilayer coating comprises a thickness of at most 35 µm,
wherein a selected composition is present in every layer of the plurality of protective layers, and the selected composition is a composition selected from a group consisting of chromium nitride, chromium aluminum nitride and titanium aluminum nitride, and
wherein each protective layer comprises a thickness of at least 10 µm.

13. A turbomachine component comprising:
a main body, which comprises a chromium steel comprising at least 8% by mass and at most 13% by mass, and
a multilayer coating comprising an adhesion promoting layer which is applied directly to the main body and which comprises chromium nitride, and a plurality of protective layers, wherein one protective layer is applied directly to the adhesion promoting layer and every other protective layer is applied directly to an underlying protective layer,
wherein the adhesion promoting layer and the plurality of protective layers are applied by a physical vapor deposition process and at a coating temperature of less than 600° C.,
wherein the multilayer coating comprises a thickness of 30 µm to 35 µm,
wherein a selected composition is present in every layer of the plurality of protective layers, and the selected composition is a composition selected from a group consisting of chromium nitride, chromium aluminum nitride and titanium aluminum nitride, and
wherein each protective layer comprises a thickness of at least 10 µm.

* * * * *